(12) United States Patent
Cao et al.

(10) Patent No.: US 9,214,399 B2
(45) Date of Patent: Dec. 15, 2015

(54) INTEGRATED CIRCUIT WITH MATCHING THRESHOLD VOLTAGES AND METHOD FOR MAKING SAME

(71) Applicant: Efficient Power Conversion Corporation, El Segundo, CA (US)

(72) Inventors: Jianjun Cao, Torrance, CA (US); Robert Beach, La Crescenta, CA (US); Alexander Lidow, Marina Del Rey, CA (US); Alana Nakata, Redondo Beach, CA (US); Robert Strittmatter, Tujunga, CA (US); Guangyuan Zhao, Torrance, CA (US); Yanping Ma, Torrance, CA (US); Chunhua Zhou, Torrance, CA (US); Seshadri Kolluri, San Jose, CA (US); Fang Chang Liu, Toufen Township (TW); Ming-Kun Chiang, Hsinchu (TW); Jiali Cao, Torrance, CA (US); Agus Jauhar, Hsinchu (TW)

(73) Assignee: Efficient Power Conversion Corporation, El Segundo, CA (US)

(*) Notice: Subject to any disclaimer, the term of this patent is extended or adjusted under 35 U.S.C. 154(b) by 0 days.

(21) Appl. No.: 14/446,985

(22) Filed: Jul. 30, 2014

(65) Prior Publication Data
US 2015/0034962 A1   Feb. 5, 2015

Related U.S. Application Data

(60) Provisional application No. 61/859,803, filed on Jul. 30, 2013.

(51) Int. Cl.
*H01L 29/00* (2006.01)
*H01L 21/8252* (2006.01)
*H01L 29/66* (2006.01)
*H01L 29/778* (2006.01)
*H01L 27/06* (2006.01)
*H01L 29/20* (2006.01)
*H01L 29/40* (2006.01)
*H01L 29/423* (2006.01)
*H01L 29/10* (2006.01)

(52) U.S. Cl.
CPC ........ *H01L 21/8252* (2013.01); *H01L 27/0605* (2013.01); *H01L 29/66462* (2013.01); *H01L 29/7786* (2013.01); *H01L 29/1066* (2013.01); *H01L 29/2003* (2013.01); *H01L 29/402* (2013.01); *H01L 29/42356* (2013.01)

(58) Field of Classification Search
CPC .................. H01L 27/0605; H01L 21/823431; H01L 29/402; H01L 29/1066; H01L 29/66462
USPC .................................. 257/192, 194; 438/283
See application file for complete search history.

(56) References Cited

U.S. PATENT DOCUMENTS

| | | | | |
|---|---|---|---|---|
| 5,341,007 | A * | 8/1994 | Kuwata | 257/194 |
| 6,563,197 | B1 * | 5/2003 | Wagers et al. | 257/630 |
| 7,829,957 | B2 * | 11/2010 | Kato et al. | 257/392 |
| 2006/0027840 | A1 | 2/2006 | Wohlmuth | |

(Continued)

*Primary Examiner* — Nathan Ha
(74) *Attorney, Agent, or Firm* — Dickstein Shapiro LLP

(57) ABSTRACT

An integrated circuit having a substrate, a buffer layer formed over the substrate, a barrier layer formed over the buffer layer, and an isolation region that isolates an enhancement mode device from a depletion mode device. The integrated circuit further includes a first gate contact for the enhancement mode device that is disposed in one gate contact recess and a second gate contact for the depletion mode device that is disposed in a second gate contact recess.

20 Claims, 6 Drawing Sheets

(56) References Cited

U.S. PATENT DOCUMENTS

| | | | |
|---|---|---|---|
| 2008/0185613 A1* | 8/2008 | Beach et al. | 257/192 |
| 2009/0230482 A1 | 9/2009 | Kato et al. | |
| 2010/0006895 A1* | 1/2010 | Cao et al. | 257/192 |
| 2011/0221011 A1 | 9/2011 | Bahat-Treidel et al. | |
| 2011/0248283 A1* | 10/2011 | Cao et al. | 257/76 |
| 2012/0091513 A1 | 4/2012 | Saimei et al. | |
| 2012/0235209 A1 | 9/2012 | Briere et al. | |
| 2012/0261720 A1 | 10/2012 | Puglisi et al. | |

* cited by examiner

INTEGRATED CIRCUIT WITH MATCHING THRESHOLD VOLTAGES AND METHOD FOR MAKING SAME

CROSS-REFERENCE TO RELATED APPLICATIONS

This application claims the benefit of U.S. Provisional Application No. 61/859,803, filed on Jul. 30, 2013, the entire disclosure of which is hereby incorporated by reference

BACKGROUND OF THE INVENTION

1. Field of the Invention

The present invention relates generally to integrated circuits and devices, and, more particularly to matching the threshold voltages of enhancement mode and depletion mode devices and reducing output capacitance of gallium nitride (GaN) devices.

2. Description of the Related Art

GaN semiconductor devices are increasingly desirable because of their ability to switch at high frequency, to carry large current, and to support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 30V-to-2000 Volts, while operating at high frequencies, e.g., 100 kHZ-100 GHz.

A GaN HEMT device includes a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted (i.e., removed) below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

In some integrated circuit designs, a high electron mobility transistor (HEMT) or pseudomorphic High-Electron Mobility Transistor ((p-)HEMT) is divided into a depletion mode transistor having a negative value of threshold voltage $V_{Th}$ and an enhancement mode transistor having a positive value of threshold voltage $V_{Th}$. In such designs, it is desirable for the absolute value of the threshold voltages $V_{Th}$ of the enhancement mode and depletion mode devices to be equal. For example, if the enhancement mode threshold voltage $V_{Th}$ is positive 1.5 volts, the depletion mode device threshold voltage $V_{Th}$ should be negative 1.5 volts.

The present invention provides an approach to achieve enhancement mode and depletion mode devices with the same absolute value.

SUMMARY OF THE INVENTION

Embodiments described below address the problems discussed above and other problems, by providing an integrated circuit having an enhancement mode device and depletion mode device that includes an isolation region isolating the two devices and a thinner region or gate contact recess in the aluminum gallium nitride (AlGaN) barrier layer under the gates that can be used to modulate the threshold voltages $V_{Th}$ of the enhancement mode and depletion mode devices so that the absolute values of the threshold voltages are approximately equal.

In particular, an integrated circuit is disclosed herein having a substrate; at least one buffer layer formed over the substrate; a barrier layer formed over the at least one buffer layer; and an isolation region formed to isolate a first portion of the barrier layer for a first transistor device from a second portion of the barrier layer for a second transistor device, the first and second portions of the barrier layer each having respective gate contact recesses. The integrated circuit further includes a first gate contact disposed at least partially in the gate contact recess of the first portion of the barrier layer for the first transistor device; and a second gate contact disposed at least partially in the gate contact recess of the second portion of the barrier layer for the second transistor device. In the exemplary embodiment, the first and second transistor devices are an enhancement mode device and depletion mode device, respectively.

One object of the exemplary embodiments is to provide a gallium nitride power device with a lower gate-drain capacitance (Cgd) and a lower output capacitance (Coss). According to an exemplary embodiment, the gate contact recess of the thinner AlGaN barrier extends outside of the gate contact towards the drain. In this embodiment, since the barrier at the drain side gate corner is thinner, the device has lower 2DEG density, and, therefore, gate-drain capacitance (Cgd) and output capacitance (Coss) are reduced.

BRIEF DESCRIPTION OF THE DRAWINGS

The above-noted and other features, objects, and advantages of the present disclosure will become more apparent from the detailed description set forth below when taken in conjunction with the drawings in which like reference characters identify correspondingly throughout and wherein.

DETAILED DESCRIPTION OF THE EXEMPLARY EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1:
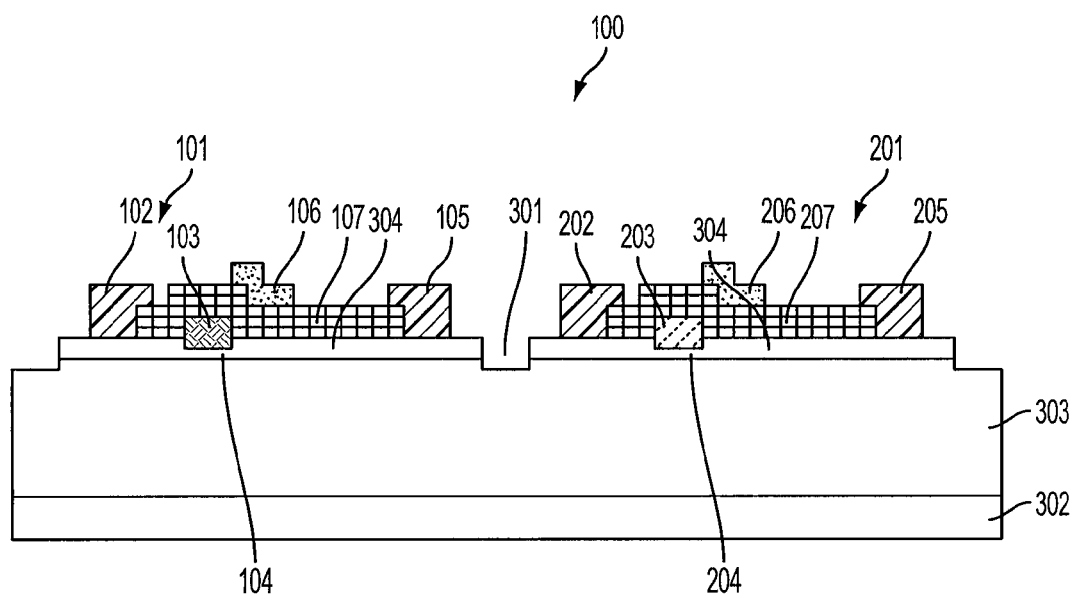
FIG. 1 illustrates an integrated circuit with enhancement mode and depletion mode devices have matching threshold voltages $V_{Th}$ according to an exemplary embodiment of the present invention.

FIG. 1 illustrates a first embodiment of the integrated circuit according to an exemplary embodiment of the present invention. As shown, the integrated circuit 100 includes an enhancement mode device 101 and a depletion mode device 201. The integrated circuit 100 is formed on a substrate 302 that is formed from silicon (Si), silicon carbide (Si), sapphire, or any other suitable material for semiconductor fabrication. Next, one or buffer layers 303 are formed on the substrate 302. The buffer layers 303 can include aluminum nitride (AlN), gallium nitride (GaN), aluminum gallium nitride, or the like. In the exemplary embodiment, one of the buffer layers (i.e., the buffer layer closest to a barrier layer 304) is a channel layer, the is preferably composed of gallium nitride (GAN). It should be understood that the channel layer can be consider as one of the buffer layers or as a separate layer between the buffer layers and the barrier layer. Furthermore, the barrier layer 304 formed from aluminum gallium nitride (AlGaN) or indium aluminum gallium nitride (InAlGaN) can be formed above the buffer layer 303, which in some embodiments can include an aluminum nitride (AlN) spacer below the AlGaN and a gallium nitride (GaN) cap above the AlGaN (not shown). As noted above, a two dimensional electron gas ("2DEG") region (not marked by a reference number) is formed at the interface between the buffer layers 303 and the barrier layer 304. For example, if the buffer layers 303 include a channel layer formed of GaN, the 2DEG region is formed at the interface between the GaN layer and the barrier layer 304.

As further shown, the enhancement mode device 101 includes a source 102, gate 103, and drain 105, with a dielectric film 107 that covers the device and an optional field plate 106. Likewise, the depletion mode device 201 includes a source 202, gate 203, and drain 205, and also includes a dielectric film 207 and an optional field plate 206. An isolation area 301 is formed in the barrier layer 304 to divide the barrier layer into first and second portions for the enhancement mode device 101 and the depletion mode device 201. It should be appreciated that although isolation area 301 is illustrated as an etched window in the barrier 304 of FIG. 1, in an alternative embodiment isolation area 301 can be formed by ion implantation as would be understood to one skilled in the art.

In order to modulate the threshold voltage $V_{Th}$ of the enhancement mode device 101, the barrier layer 304 includes thinner portion 104 (i.e., a gate contact portion 104) under the gate 103, relative to the portions of the barrier layer 304 not disposed under the gate 103. The thinner portion 104 of the barrier layer under gate 103 increases the value of the positive threshold voltage $V_{Th}$. As shown in FIG. 1, the gate 103 extends the entire width of the gate contact recess 104. Similarly, to modulate the threshold voltage $V_{Th}$ of the depletion mode device 201, the barrier layer 304 includes thinner portion 204 (i.e., a gate contact portion 204) under the gate 203, relative to the portions of the barrier layer 204 not disposed under the gate 203. The thinner portion 204 of the barrier layer under the gate 203 decreases the value of the negative threshold voltage $V_{Th}$. As shown in FIG. 1, the gate 203 extends the entire width of the gate contact recess 204.

In the exemplary embodiment of the integrated circuit 100 illustrated in FIG. 1, the AlGaN barrier recess, or a thinner barrier (i.e., the gate contact recesses) 104, 204 under the gates 103, 203, respectively, can be used to modulate the threshold voltages $V_{Th}$ of the enhancement mode device 101 and the depletion mode device 201, so that the absolute values of the threshold voltages are approximately equal. In particular, during fabrication the thicknesses of the gate contact recesses can be adjusted for the respective devices such that the absolute values of the threshold voltages are approximately equal.

Figure 2:
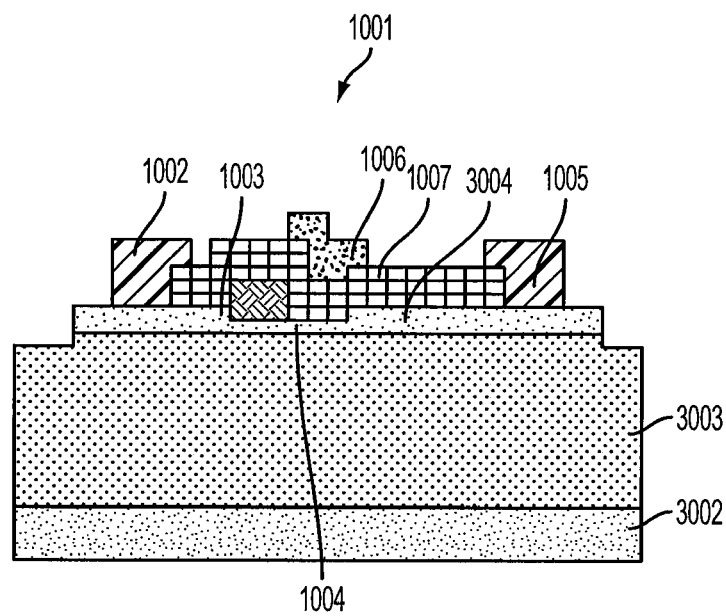
FIG. 2 illustrates the enhancement mode device of integrated circuit 100 according to an alternative embodiment of the present invention.

FIG. 2 illustrates the enhancement mode device of integrated circuit 100 according to an alternative embodiment of the present invention. Similarly, FIG. 3 illustrates the depletion mode device of integrated circuit 100 according to an alternative embodiment of the present invention.

Figure 3:
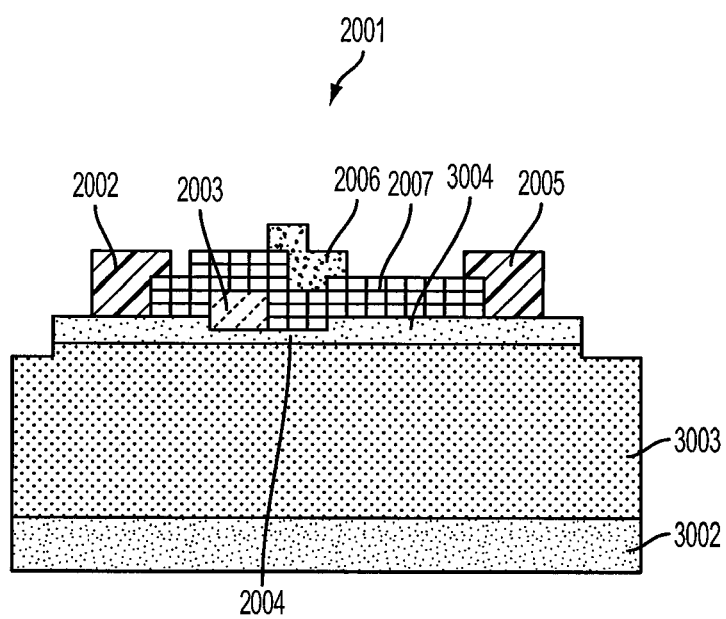
FIG. 3 illustrates the depletion mode device of integrated circuit 100 according to an alternative embodiment of the present invention.

As shown in these embodiments of FIGS. 2 and 3, the recessed barrier 1004, 2004 of the enhancement mode device 1001 and the depletion mode device 2001 extends outside or past the sides/edges of the gate 1003, 2003, towards the drain 1005, 2005. This configuration further reduces the output capacitance Coss, the gate-drain capacitance Cgd and the drain-source leakage and also improves drain-to-source breakdown voltage.

It is noted that each of the enhancement mode device 1001 and the depletion mode device 2001 illustrated in FIGS. 2 and 3, respectively, are otherwise identical to those devices shown in FIG. 1. In particular, enhancement mode device 1001 shown in FIG. 2 includes a source 1002, gate 1003, and drain 1005, a dielectric film 1007 that covers the device and an optional field plate 1006. Similarly, the depletion mode device 2001 shown in FIG. 3 includes a source 2002, gate 2003, and drain 2005, a dielectric film 2007 that covers the device and an optional field plate 2006.

Figure 4:
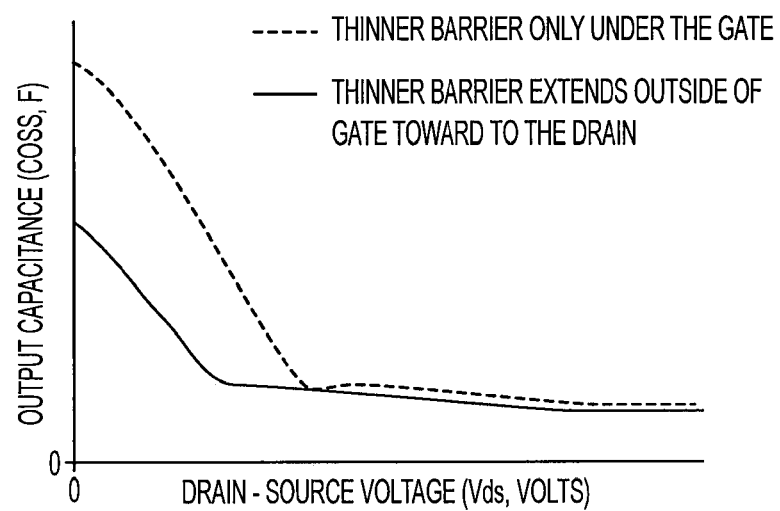
FIG. 4 is a schematic comparison of output capacitance ($C_{oss}$) of a device with the thinner barrier under the gate only and another device with the thinner barrier extending outside the gate toward the drain according to exemplary embodiments of the present invention.

FIG. 4 schematically illustrates a degree of reduction in output capacitance Coss by extending the thinner AlGaN barrier outside of the gate towards the drain as shown in the embodiments of FIGS. 2 and 3. As shown, output capacitance Coss for the devices embodied in FIGS. 2 and 3 is lower when the drain to source voltage (Vds) is relatively low.

Figure 5A:
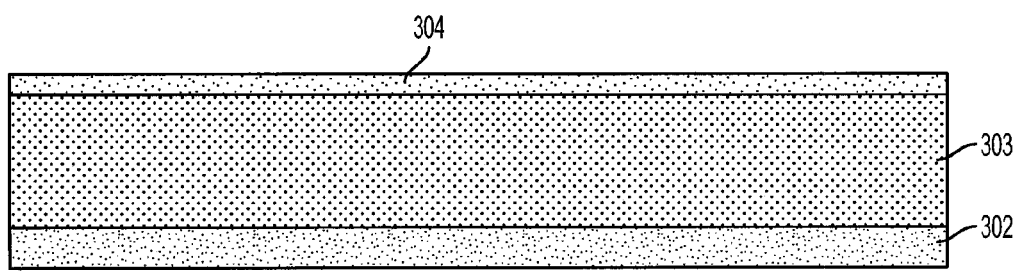
FIGS. 5A-5F illustrate a fabrication process to form an integrated circuit with an enhancement mode device and a depletion mode device that have matching threshold voltages $V_{Th}$ according to exemplary embodiments of the present invention.

FIGS. 5A-5F illustrate a method for manufacturing an integrated circuit 100 having an enhancement mode device 101 and a depletion mode device 201 according to an exemplary embodiment of the present invention Initially, as shown in FIG. 5A, an EPI is grown on a substrate 302. As noted above, substrate 302 is formed from silicon (Si), silicon carbide (SiC), sapphire, or any other suitable material. One or more buffer layers are then formed on top of the substrate 302. The buffer layers 303 can include AlN, AlGaN, and GaN. The AlGaN barrier layer 304 can then be formed above the buffer layers 303. In one embodiment, an AlN spacer can be provided below the AlGaN barrier layer 304 and an GaN cap can be provided above the AlGaN barrier layer 304. Each of the layers of EPI structure can be deposited or otherwise formed over substrate 302 using conventional deposition techniques as would be understood to one skilled in the art.

Figure 5B:
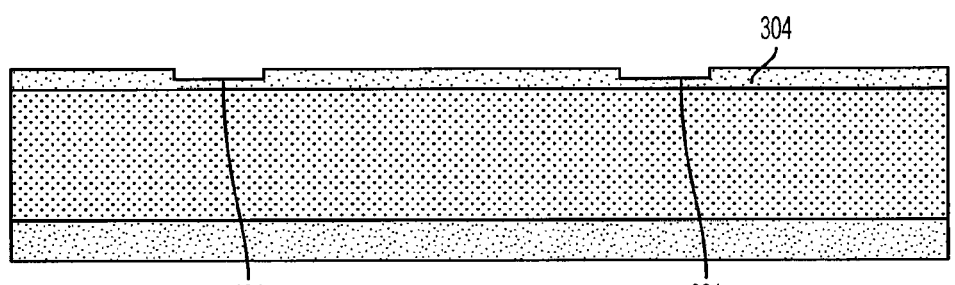

Next, as shown in FIG. 5B, a photoresist (not shown) is applied to the structure and portions of the barrier layer 304 are partially etched. This etching results in a barrier layer 304 with two areas 104, 204 that are thinner (i.e., a smaller thickness) than the rest of the barrier layer 304.

Figure 5C:
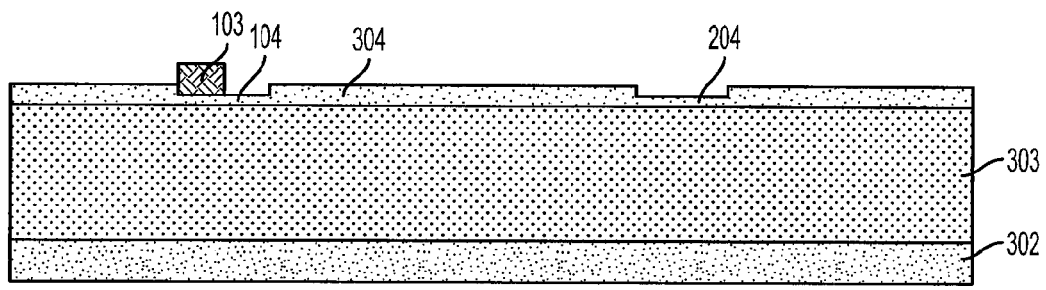

After these thinner portions of barrier layer 304 have been formed, a pGaN layer is grown over the top surface, which is patterned and etched to form the enhancement mode device gate 103 as shown in FIG. 5C. In the example shown, the thinner barrier 104 extends outside of the gate 103 similar to the embodiment illustrated in FIG. 3.

Figure 5D:
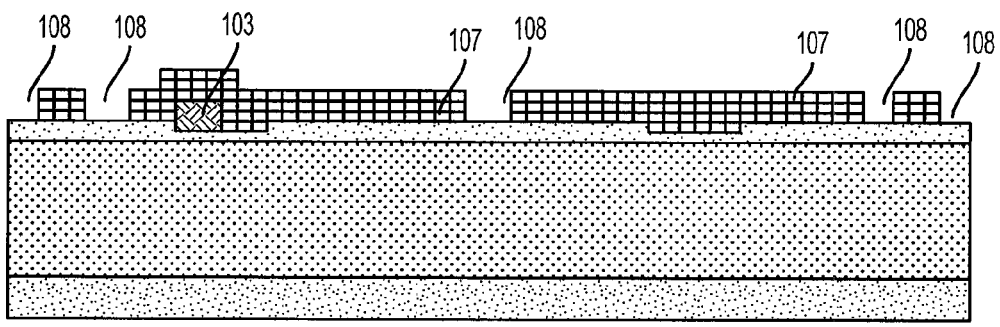

Next, with reference to FIG. 5D, a dielectric layer 107 is deposited over the gate 103, thinner portion 104, the thinner portion 204 and the rest of the barrier layer 304. The dielectric layer 107 is patterned to remove the areas (i.e., create contact open window 108) for the source and drain contacts.

Figure 5E:
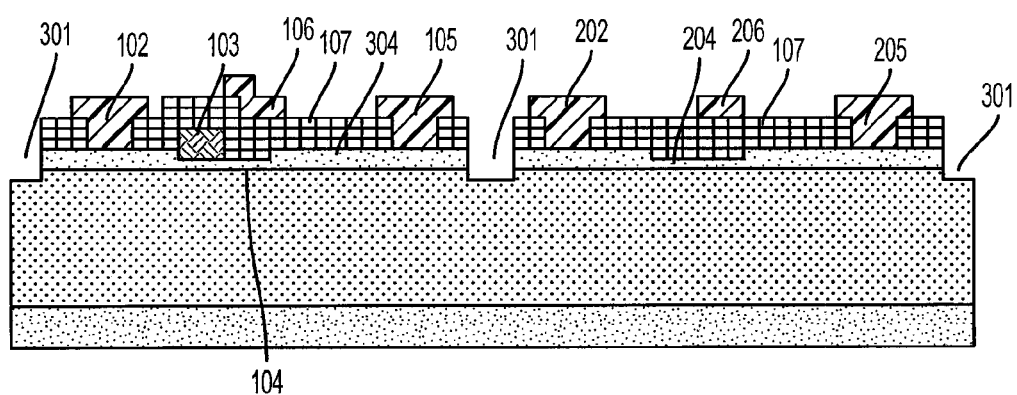
Figure 5F:
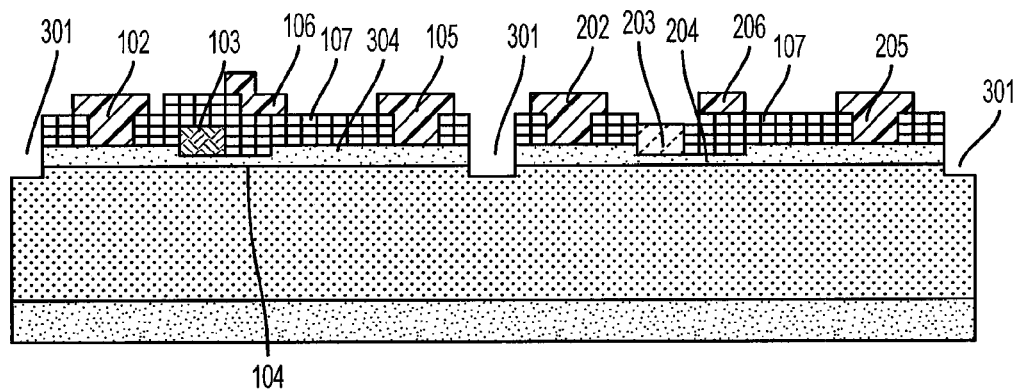

As shown in FIG. 5E, after the contact open windows are formed 108, an Ohmic contact layer is deposited. In the exemplary embodiment, the contact layer typically contains Ti, Al, and a cap layer. FIG. 5E illustrates that the contact layer is patterned and etched to form source contacts 102, 202, drain contacts 105, 205; and field plates 106, 206 of the enhancement mode and depletion mode devices, respectively. During the etching of the contact layer metal, an isolation area 301 between the two devices can be formed as it etches though the barrier layer to divide the layer into first and second portions. Finally, as shown FIG. 5F, the structure is patterned and etched to form an opening in the dielectric film 107 of the depletion mode device. A Schottky metal is deposited into this opening and lifted off to form the gate 203 of the depletion mode device.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A method for fabricating an integrated circuit, the method comprising:
    forming at least one buffer layer on a substrate layer;
    forming a barrier layer over the at least one buffer layer;
    forming a photoresist on the barrier layer;
    etching the barrier layer to form first and second gate contact recesses;
    forming a first gate contact in one of the first and second gate contact recesses;
    depositing a dielectric layer over the barrier layer;
    etching the dielectric layer and the barrier to form a plurality of contact openings in the dielectric layer;
    depositing an Ohmic contact layer in the plurality of contact openings to form respective source and drain contacts for first and second transistor devices, wherein the first transistor device is an enhancement mode device and the second transistor device is a depletion mode device, wherein the step of etching the barrier layer to form first and second gate contact recesses comprises forming each of the first and second gate contact recesses with a thickness such that an absolute value of a threshold voltage of the enhancement mode device is approximately equal to an absolute value of a threshold voltage of the depletion mode device; and
    forming an isolation region in the barrier layer between the first and second gate contact recesses.

2. The method according to claim 1, further comprising:
    etching the dielectric layer over one of the first and second gate contact recesses; and
    depositing a Schottky metal to form a second gate contact in a second of the first and second gate contact recesses.

3. The method according to claim 1, wherein the step of forming the first gate contact in one of the first and second gate contact recesses comprises forming the first gate contact only partially in the gate contact recess.

4. The method according to claim 1, wherein the first gate contact is made from a p-type material.

5. The method according to claim 4, wherein the p-type material is pGaN.

6. The method according to claim 4, wherein the first gate contact extends an entire width of the first gate contact recess.

7. The method according to claim 2, wherein the second gate contact extends an entire width of the second gate contact recess.

8. The method according to claim 6, wherein the second gate contact extends an entire width of the second gate contact recess.

9. The method according to claim 2, wherein respective uncovered portions of the gate contact recesses each extend towards the respective drain contacts.

10. The method according to claim 2, wherein the first gate contact is made from a p-type material.

11. The method according to claim 10, wherein the p-type material is pGaN.

12. A method for fabricating an integrated circuit, the method comprising:
    forming at least one buffer layer on a substrate layer;
    forming a barrier layer with a thickness over the at least one buffer layer;
    partially etching the barrier layer to form first and second gate contact recesses wherein the gate contact recesses reduce the thickness of the barrier layer in their respective locations;
    forming a first gate contact in the first gate contact recess;
    depositing a dielectric layer over the barrier layer;
    etching the dielectric layer and the barrier to form a plurality of contact openings in the dielectric layer;
    depositing an Ohmic contact layer in the plurality of contact openings to form respective source and drain contacts for first and second transistor devices;
    forming an isolation region in the barrier layer between the first and second gate contact recesses wherein the isolation region separates an enhancement mode device from a depletion mode device; and
    etching the dielectric layer over the second gate contact recess and forming a second gate contact in the second gate contact recess.

13. The method according to claim 12, wherein the step of partially etching the barrier layer to form first and second gate contact recesses comprises reducing the thickness of the barrier layer under the respective gate contact recesses such that an absolute value of a threshold voltage of the enhancement mode device is approximately equal to an absolute value of a threshold voltage of the depletion mode device.

14. The method according to claim 12, wherein the first gate contact is made from a p-type material.

15. The method according to claim 14, wherein the p-type material is pGaN.

16. The method according to claim 12, wherein the first gate contact extends an entire width of the first gate contact recess.

17. The method according to claim 16, wherein the second gate contact extends an entire width of the second gate contact recess.

18. The method according to claim a 12, wherein the second gate contact extends an entire width of the second gate contact recess.

19. The method according to claim 12, wherein respective uncovered portions of the gate contact recesses each extend towards the respective drain contacts.

20. The method according to claim 12, wherein the second gate contact is formed by depositing a Schottky metal in the second gate contact recess.

* * * * *